United States Patent
Brueckner

(10) Patent No.: US 11,945,715 B2
(45) Date of Patent: Apr. 2, 2024

(54) METHOD FOR DETERMINING AT LEAST ONE TEMPERATURE COMPENSATION PARAMETER FOR THE COMPENSATION OF TEMPERATURE EFFECTS ON THE MEASURED VALUES OF A SENSOR SYSTEM

(71) Applicant: Robert Bosch GmbH, Stuttgart (DE)

(72) Inventor: Hans-Peter Brueckner, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 671 days.

(21) Appl. No.: 17/089,160

(22) Filed: Nov. 4, 2020

(65) Prior Publication Data
US 2021/0139318 A1 May 13, 2021

(30) Foreign Application Priority Data
Nov. 11, 2019 (DE) .......................... 102019217333.0

(51) Int. Cl.
*G01F 1/86* (2006.01)
*B81B 7/00* (2006.01)
(Continued)

(52) U.S. Cl.
CPC ............ *B81B 7/009* (2013.01); *G01K 7/42* (2013.01); *G01F 1/86* (2013.01); *G01P 21/00* (2013.01)

(58) Field of Classification Search
CPC . B81B 7/009; G01K 7/42; G01K 1/20; G01K 15/00; G01K 1/14; G01K 13/00;
(Continued)

(56) References Cited

U.S. PATENT DOCUMENTS

2003/0200785 A1* 10/2003 Platt .................. G01C 19/5719
73/1.37
2004/0159099 A1* 8/2004 Kuboshima ......... F02D 41/2474
60/297
(Continued)

FOREIGN PATENT DOCUMENTS

DE    102018216543 B3 * 1/2020 ........... B81B 3/0064
EP    2191235 A1    6/2010
(Continued)

OTHER PUBLICATIONS

Translation of CN 106482752 (Year: 2017).*
17089160_2023-12-06_DE_102018216543_B3_H.pdf, Jan. 2, 2020.*

*Primary Examiner* — Gail Kaplan Verbitsky
(74) *Attorney, Agent, or Firm* — NORTON ROSE FULBRIGHT US LLP; Gerard A. Messina

(57) ABSTRACT

A method for determining a temperature compensation parameter for compensation of temperature effects on measured values of a sensor system having a sensor unit for acquiring measured values of a sensor measuring variable. The method includes: monitoring the measuring situation of the sensor unit; determining whether the current measuring situation corresponds to a reference measuring situation for which a reference measured value of the sensor measuring variable is known; monitoring the temperature of the sensor unit; determining whether the current temperature lies within a predefined temperature range; acquiring different temperature values within the predefined temperature range and acquiring the respective associated measured values of the sensor measuring variable when the current measuring situation corresponds to a reference measuring situation; determining a temperature compensation parameter based on the reference measured value of the sensor measuring variable, the different temperature values, and the associated measured values of the sensor measuring variable.

14 Claims, 7 Drawing Sheets

(51) Int. Cl.
*G01K 7/42* (2006.01)
*G01P 21/00* (2006.01)

(58) Field of Classification Search
CPC .......... G01K 1/16; G01D 18/00; G01L 19/14;
G01L 19/0092; G01L 9/0041
USPC ............................... 374/1, 170, 178, 143, 45
See application file for complete search history.

(56) References Cited

U.S. PATENT DOCUMENTS

| | | | | |
|---|---|---|---|---|
| 2005/0114061 | A1* | 5/2005 | Gauthier | G01K 15/00 374/E15.001 |
| 2009/0154519 | A1* | 6/2009 | Price | G01J 5/16 374/1 |
| 2013/0055826 | A1* | 3/2013 | Qasimi | G01F 1/692 73/861.02 |
| 2015/0168234 | A1* | 6/2015 | Murakami | G01K 15/005 374/1 |
| 2017/0167946 | A1* | 6/2017 | Coronato | B81B 7/0041 |
| 2018/0335326 | A1* | 11/2018 | Paci | G01K 13/00 |
| 2022/0136913 | A1* | 5/2022 | Drasal | B81B 7/02 73/774 |

FOREIGN PATENT DOCUMENTS

| | | | | |
|---|---|---|---|---|
| EP | 1668333 B1 | * | 11/2015 | ........... G01L 27/005 |
| JP | 2005291861 A | * | 10/2005 | |

* cited by examiner

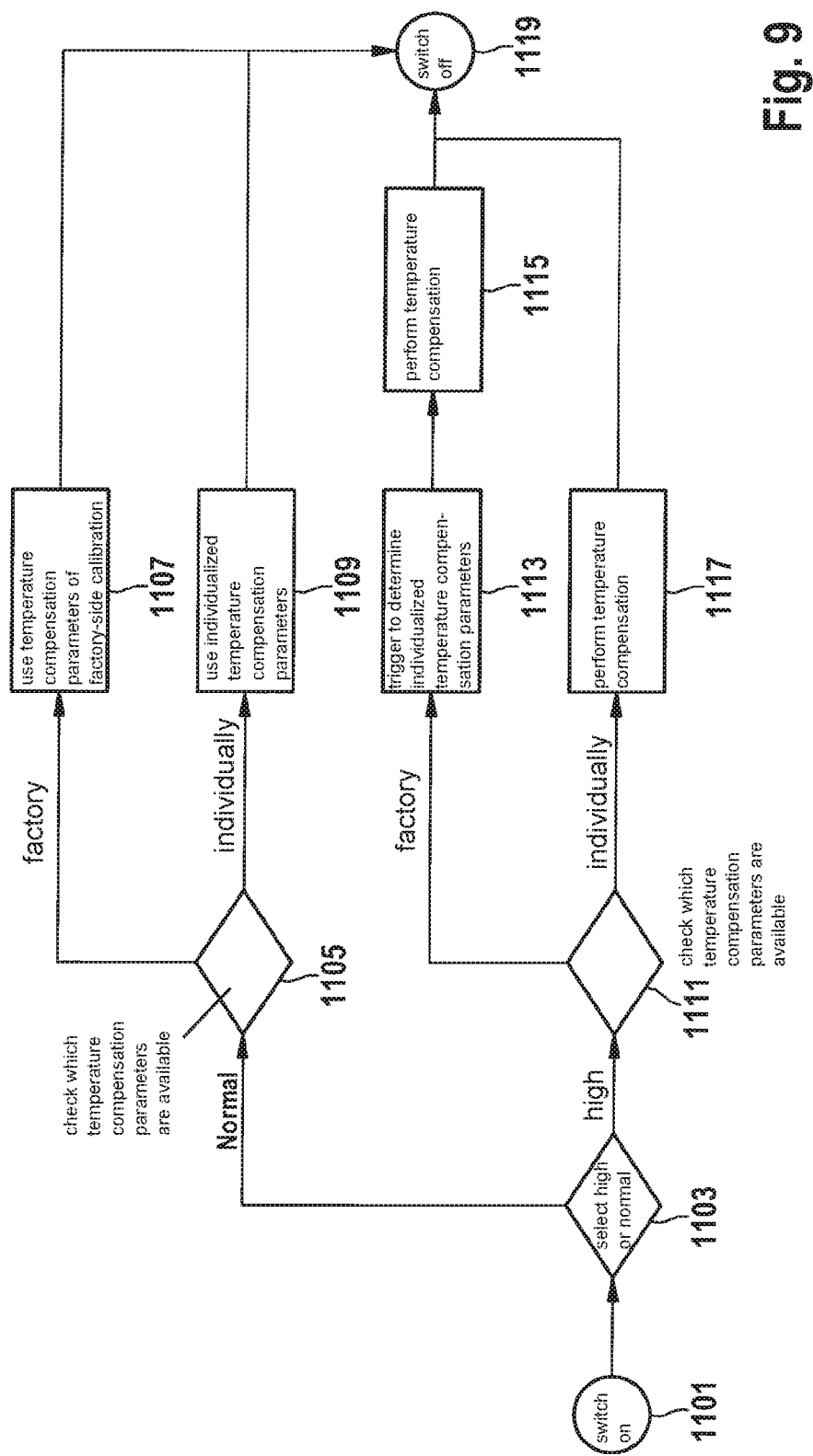

METHOD FOR DETERMINING AT LEAST ONE TEMPERATURE COMPENSATION PARAMETER FOR THE COMPENSATION OF TEMPERATURE EFFECTS ON THE MEASURED VALUES OF A SENSOR SYSTEM

CROSS REFERENCE

The present application claims the benefit under 35 U.S.C. § 119 of German Patent Application No. DE 102019217333.0 filed on Nov. 11, 2019, which is expressly incorporated herein by reference in its entirety.

FIELD

The present invention relates to a method for determining at least one temperature compensation parameter for the compensation of temperature effects on the measured values of a sensor system. In addition, the present invention relates to a MEMS sensor system designed to execute the method.

BACKGROUND INFORMATION

The ongoing miniaturization of sensor surfaces of conventional sensor systems, in particular MEMS sensor systems, is accompanied by technical challenges such as the integration of microcontrollers into the sensor system in order to cover different application scenarios, or a component-individual correction of temperature-related offset and sensitivity inaccuracies of the sensor measuring results.

Temperature effects of the sensor units can lead to temperature-related inaccuracies of the measuring results of the sensor units. At present, such inaccuracies are able to be corrected by comparing the measuring results of corresponding sensor systems for certain temperature interpolation points with measuring results of suitable reference sensor systems, which serve as reference values. However, such comparisons with reference sensor systems fail to take into account the influence of individual factors such as production-related, individual characteristics of the various sensor systems, which may lead to additional measuring inaccuracies.

For cost-related reasons, measurements for the correction of temperature-related measuring inaccuracies during the production at the factory are able to be carried out only for isolated temperature interpolation points. However, such measurements only for isolated temperature interpolation points are not sufficient to achieve a comprehensive correction.

There is consequently a need for an individual correction of temperature-related measuring inaccuracies which is adaptable to individual systems and satisfies the demands on current sensor systems insofar as it takes individual factors and a high number of temperature interpolation points into account.

SUMMARY

An object of the present invention is to provide an efficient method for the adaptive compensation of temperature effects on the measured values of a sensor system and providing a corresponding sensor system, which is designed to execute such a method.

This objective may be achieved by example embodiments of the present invention. Advantageous embodiments of the present invention described herein.

According to a first aspect of the present invention, a method is provided for determining at least one temperature compensation parameter for the compensation of temperature effects on the measured values of a sensor system. In accordance with an example embodiment of the present invention, the sensor system include at least:
  a. a sensor unit for acquiring measured values of a sensor measuring variable,
  b. a temperature sensor unit for acquiring the temperature of the sensor unit, and
  c. a signal processing unit for determining at least one temperature compensation parameter and for compensating temperature effects on the measured values of the sensor unit;

and in accordance with an example embodiment of the present invention, the method includes:
  Monitoring the measuring situation of the sensor unit and determining whether the current measuring situation corresponds to a reference measuring situation for which at least one reference measured value of the sensor measuring variable is known,
  Monitoring the temperature of the sensor unit and determining whether the current temperature lies within a predefined temperature range,
  Acquiring at least two different temperature values within the predefined temperature range, and acquiring the respective associated measured values of the sensor measuring variable when the current measuring situation corresponds to a reference measuring situation;
  Determining at least one temperature compensation parameter on the basis of the at least one reference measured value of the sensor measuring variable, the at least two different temperature values, and the associated measured values of the sensor measuring variable.

The method according to the example embodiment of the present invention makes it possible to determine component-specific temperature compensation parameters during an ongoing operation, i.e., in the application situation, and if desired, to update them on a continuous basis. Based on these temperature compensation parameters, a compensation of the temperature effects on the measured values is then able to be carried out, which takes into account both the component-specific behavior and changes over the service life. The example method according to the present invention thus represents an alternative or at least a supplement to the factory-side calibration of the sensor system.

In this way, it is also possible to adapt initial temperature compensation parameters of the sensor system that were determined at the factory, that is to say, prior to the initial operation of the sensor system in the application situation.

Through the repeated correction and adaptation of the temperature compensation parameters of the sensor units of the sensor system, a high measuring accuracy of the sensor system is able to be achieved. For example, the repeated correction and adaptation of the temperature compensation parameters makes it possible to compensate for a time variance of the temperature behavior of the sensor system. For instance, the conditions in the overall system may change over a period of time as a result of, for example, mechanical tensions in the structure of the sensor system, which may lead to a changed temperature behavior.

In addition, the method for determining temperature compensation parameters for a sensor system is able to be carried out by the sensor system itself when it is already installed in its final location. Since assembly-related effects and effects caused by the environment are also taken into account in the process, a better compensation of the temperature effects on the measured values is able to be achieved based on these temperature compensation parameters instead of the temperature compensation parameters determined at the factory. Moreover, for time and cost-related reasons, there are limits to the factory-side determination of the temperature compensation parameters, which means that only the temperature behavior of a reference group of sensor units rather than the individual temperature behavior of each individual sensor unit is always taken into account. Factory-side, individual calibrations of individual sensor systems on corresponding measuring stations are actually technically feasible at present. However, this does not constitute an economical solution in view of the high costs such a time-intensive step would entail after the production of the respective sensor systems. As a result, sensor systems are currently calibrated at the factory solely on the basis of results of a corresponding series of reference measurement conducted on reference groups of representative sensor systems in that the parameters ascertained for the reference groups are simply transferred to the sensor systems to be calibrated. However, individual factors that may affect the measuring response of a sensor system are not taken into account.

The user is able to carry out the method for determining a temperature compensation parameter of measured values for a sensor system at individually determined times or the method may be carried out automatically according to a predefined time schedule stored in the signal processing unit. For example, the present method may be performed during the first installation of the sensor system at the intended location of the system. It is optionally also possible to carry the present method out repeatedly across the entire service life of the sensor system in accordance with a predefined time schedule. In addition, the present method may optionally also be carried out after certain predefined conditions have occurred. For example, a calibration of the sensor system using the present method for determining a temperature compensation parameter is able to be performed after an upper temperature limit has been exceeded or after a drop below a lower temperature limit has occurred. Apart from the mentioned temperature limits, further parameters with corresponding limit values whose attainment or exceeding triggers an automatic execution of the present method are conceivable as well. Alternatively, the present method is able to be carried out during each startup process of the sensor system in which the sensor system is started up from an idle state to an operating state.

For this purpose, the measuring situation of the sensor unit is monitored and it is checked whether the current measuring situation of the sensor unit corresponds to a reference measuring situation of the sensor unit.

A measuring situation of the sensor unit describes the current state of the sensor unit. In the case of an inertial sensor, for example, the measuring situation may include whether the sensor unit is in a neutral position or is subject to an acceleration. The respective measuring situation may vary accordingly in other types of sensor units.

A reference measuring situation of a sensor unit describes a reference state of a sensor unit of the same type for which measured values of a sensor measuring variable for a sensor unit of the same type are known as reference values for the reference state or the reference measuring situation.

In addition, the temperature of the sensor unit is monitored and it is determined whether the temperature of the sensor unit lies within a predefined temperature range, i.e., in particular within the temperature range for which a determination of temperature compensation parameters is to be carried out. The predefined temperature range may depend on the type of the individual sensor unit and on the type of the respective intended use of the sensor unit.

If the measuring situation of the sensor unit corresponds to a reference measuring situation and if the temperature of the sensor unit is within the predefined temperature range, then the temperature sensor unit acquires the temperature value and the sensor unit acquires the associated measured value. This temperature acquisition and measured value acquisition has to be carried out at least twice when the sensor unit is in the reference measuring situation and at different temperatures, so that at least two measured values of the sensor unit are available in the reference measuring situation but at different temperatures.

At least one temperature compensation parameter is determined on the basis of the at least two acquired temperature values, the at least two acquired measured values of the sensor measuring variable, and the at least one reference value of the sensor measured variable for the reference measuring situation.

For example, a temperature compensation parameter can be a parameter of a model or a mathematical function that is able to describe a temperature characteristic of the sensor measuring variable. A temperature compensation parameter, for instance, may be a gradient of an axis intercept of a linear function by which a linear temperature characteristic of the measured sensor variable is able to be described. Alternatively, a temperature compensation parameter may be a coefficient of a polynomial function that can describe a non-linear temperature characteristic of the sensor measuring variable. As an alternative, a temperature compensation parameter may be a parameter or a coefficient of a more complex model by which a temperature characteristic of the sensor measuring variable is able to be described. The method according to the present invention for determining temperature compensation parameters therefore allows for an adaptation of the model for the temperature characteristic of the sensor measuring variable in an individualized manner for the respective sensor unit.

On the basis of this individualized model, a temperature compensation of the measured values of the sensor unit acquired during the operation of the sensor system is able to be carried out, i.e., in the entire predetermined temperature range and thus for a variety of measured values. This temperature compensation is based on the assumption that the sensor unit exhibits the same temperature response in every measuring situation as in the reference measuring situation.

Hereinafter, a sensor measuring variable is a physical variable that is able to be acquired with the aid of the respective sensor unit of the sensor system. For example, this may be a rate of rotation, an acceleration or a pressure. Alternatively, however, the measured variable may also include further physical variables.

Below, a reference value is a comparison value for a measured value of a sensor measuring variable of a sensor unit of the sensor system. The reference value is used as a comparison value when determining the temperature compensation parameter and indicates an expected value of the respective measuring variable that would be expected for the corresponding sensor unit and the respective temperature value given an optimal calibration of the sensor unit. The reference value or values are able to be ascertained by a previously performed comparison measurement of a comparable sensor unit or the same sensor unit and stored in the signal processing unit or an external signal processing unit of the sensor system. The reference value may be a numerical value of a measured value of the sensor measuring variable.

According to a further specific embodiment of the present invention, the measuring situation is monitored with the aid of at least one further sensor component and/or with the aid of a circuit system, which is/are part of the sensor system or the device together with which the sensor system is installed.

This may achieve the technical advantage that a precise determination of a measuring situation is possible.

According to a further specific embodiment of the present invention, the difference between the at least two different temperature values is greater than a predefined threshold value.

This may achieve the technical advantage of realizing a precise determination of the temperature compensation parameters. The threshold value ensures a clear separation of the temperature values and the associated measured values of the sensor unit.

According to a further specific embodiment of the present invention, the at least one temperature compensation parameter is determined as a model parameter for a model that describes the temperature effect on the sensor measuring variable, so that a temperature compensation variable for the measured value acquired at this temperature value is able to be determined for a random temperature value on the basis of this model. The temperature compensation variable usually involves a correction factor for the measured value or a correction value which is added to the measured value.

This may achieve the technical advantage that temperature compensation variables are able to be determined on the basis of the model for any temperature within the temperature range covered by the model without having to acquire reference measured values of the sensor measuring variable for this temperature.

According to a further specific embodiment of the present invention, the at least one temperature compensation parameter is determined as a coefficient and/or a constant of a function that describes the functional relationship between the temperature and the sensor measuring variable in a reference measuring situation within the predefined temperature range, thereby making it possible to determine on the basis of this function a temperature compensation variable for the measured value acquired at this temperature value for a random temperature value.

This may achieve the technical advantage that temperature compensation variables are able to be determined on the basis of the function for a random temperature within the temperature range covered by the function without the need to acquire reference measured values of the sensor measuring variable for this temperature.

According to a further specific embodiment of the present invention, the signal processing unit and/or at least one further component of the sensor system is/are selectively actuated in order to heat and/or cool the sensor unit to at least a first and/or at least a second temperature value within the predefined temperature range and to acquire the respective associated measured values of the sensor measuring variable.

In this way, the sensor unit is able to be actively brought to two different suitable temperature values within the predefined temperature range at which the measured value of the sensor unit is then acquired as well in order to then determine the at least one temperature compensation parameter according to the present invention. The temperature compensation parameter is thereby able to be determined more rapidly.

According to a further specific embodiment of the present invention, the example method is carried out during the installation and/or in a start phase of the sensor system and/or repeatedly, at regular time intervals, and/or automatically in an event-controlled and/or a user-initiated manner.

This may achieve the technical advantage of realizing a high measuring accuracy of the sensor system. Depending on the demands on the measuring accuracy of the sensor system, it may be calibrated as often as desired while the sensor system is in operation. If only relatively low demands are made on the measuring accuracy of the sensor system, it may be calibrated a single time during the installation of the sensor system. For relatively greater demands on the measuring accuracy, the sensor system is able to be calibrated at widely variable time intervals. Given high demands on the measuring accuracy, a calibration is alternatively able to be performed during each start phase of the sensor system in which the sensor system is brought out of the idle state and to the operating state.

According to a further specific embodiment of the present invention, a temperature-dependent offset of the sensor measuring variable and/or the temperature dependency of the response behavior of the sensor unit is compensated on the basis of the at least one temperature compensation parameter.

This may achieve the technical advantage of a broad application range of the example method.

Below, an offset is an output value indicated by a sensor unit when it is in a non-excited state in which it does not experience any external excitation and should therefore indicate the zero value. Hereinafter, a sensitivity or response behavior of a sensor unit is a measuring accuracy for measured values not equal to zero that are determined from the deflection of the sensor unit for predefined external excitations. Both the offset and the sensitivity of a sensor unit may be temperature-dependent.

The actuation of different system components of the sensor system causes these system components to generate a heat quantity commensurate with the operation due to the operation according to the actuation. The sensor unit and in particular the sensor system is subsequently heated according to the heat quantity by a thermal contact. The sensor system is therefore able to be brought to a desired temperature value by a controlled operation of individual system components. For instance, the signal processing unit may be actuated to carry out arithmetic operations in order to bring the system components to a temperature value as a result of the execution of the respective operations. Alternatively, it is also possible to actuate an external signal processing unit to carry out corresponding operations. In the same way, for instance, a display of an overall system including a sensor system is able to be operated so that the heat generated by the operation of the display induces heating of the sensor system and in particular heating of the sensor units of the sensor system.

According to one specific embodiment of the present invention, the determination of the temperature compensation parameters is furthermore able to be carried out on the basis of a predefined temperature compensation parameter, the temperature compensation parameter being an adaptation of the predefined temperature compensation parameter.

This may achieve the technical advantage that already predefined values are able to be taken into account for determining the temperature compensation variable so that the determined temperature compensation variable is obtained by a modification of the predefined temperature compensation parameter.

A predefined temperature compensation parameter may be a temperature compensation parameter which has been determined at the factory for a sensor system of the same type, e.g., in a series of reference measurements, and is then used as a non-individualized parameter for the temperature compensation or calibration of the sensor system. Alternatively, a predefined temperature compensation parameter may be a temperature compensation parameter which has been determined at an earlier point in time according to the method of the present invention.

In the event that the temperature compensation parameter is a parameter determined in a non-individualized manner at the factory, the example method according to the present invention makes it possible to achieve an individualization and adaptation of the predefined temperature compensation parameter to the respective sensor system.

In the event that the temperature compensation parameter is a temperature compensation parameter determined at an earlier point in time with the aid of the example method according to the present invention, then a renewed execution of the method according to the present invention at a later time makes it possible to adapt the temperature compensation parameter determined at an earlier time to states of the respective sensor system at the time of the repeated execution of the present method.

In this way a precise temperature compensation and calibration of the system individually adapted to the respective sensor system is achievable, in which a state of the respective sensor system which it assumes at the time of the execution of the present method is able to be taken into account.

According to one specific embodiment of the present invention, the reference value and/or the temperature compensation parameter is/are stored in the signal processing unit and/or in an external memory unit.

This may achieve the technical advantage that a repeatability of the determination of the temperature compensation parameters is possible. Reference values that were established at the factory at the conclusion of the production process of the sensor system with the aid of a corresponding series of measurements are able to be used for determining the temperature compensation parameters. Alternatively, it is also possible to use reference values that were established during an operation of the sensor system with the aid of corresponding series of measurements. In the process older reference values may be replaced by more up-to-date reference values.

The temperature compensation parameters determined according to the present invention may also be stored. This allows for a comparison of temperature compensation parameters that were determined at different times, which in turn allows for a premature cancelation of the present method in the event that a check reveals that the temperature compensation parameter ascertained up to the time of the check corresponds to the temperature compensation parameters determined at earlier instants. In this way a new calibration of the sensor system can be avoided if the sensor system is already calibrated as a result of an earlier calibration.

According to a second aspect of the present invention, a sensor system is provided. In accordance with an example embodiment of the present invention, the sensor system includes at least:

a sensor unit for acquiring measured values of a sensor measuring variable;

a temperature sensor unit for acquiring a temperature value of the sensor system; and a signal processing unit, which is designed to monitor the measuring situation of the sensor unit and to determine whether the current measuring situation corresponds to a reference measuring situation for which at least one reference measured value of the sensor measuring variable is known;

to monitor the temperature of the sensor unit and to determine whether the current temperature lies within a predefined temperature range;

to actuate the sensor unit and the temperature sensor unit so that at least two different temperature values are acquired within the predefined temperature operating range together with the respective associated measured values of the sensor measuring variable when the current measuring situation corresponds to a reference measuring situation; and to determine at least one temperature compensation parameter on the basis of the at least one reference measured value of the sensor measuring variable, the at least two different temperature values and the associated measured values of the sensor measuring variable.

This may achieve the technical advantage that a sensor system is provided which is automatically able to determine at least one temperature compensation parameter that forms the basis of the compensation of temperature effects on the measured values of a sensor unit of the sensor unit. The determination of the temperature compensation parameter(s) is able to be carried out during the operation of the sensor system when it has already been installed at its final destination. As a result, a temperature compensation on the basis of the determined temperature compensation parameters is able to be performed for different temperature values within a predefined temperature range and for different measuring situations over the entire service life of the sensor system. This achieves a greater measuring accuracy of the MEMS sensor system. In addition, a temperature compensation of the measured values of the sensor unit of the sensor system that is individually more optimally adapted to the respective sensor system and its use is achievable in that the temperature compensation parameters are determined individually for the sensor unit or the sensor system when the sensor system is already installed at its operation site.

According to one specific embodiment of the present invention, the sensor system includes at least one further sensor component and/or a circuit system for monitoring the measuring situation of the sensor unit.

This may achieve the technical advantage that the measuring situation is able to be determined in a precise manner.

According to one specific embodiment of the present invention, the sensor system has at least one data memory for the acquired at least two different temperature values and the respective associated measured values of the sensor measuring variable and/or for the at least one temperature compensation parameter and/or for a predefined threshold value $\Delta T$ for the difference between the at least two different temperature values.

This may achieve the technical advantage that the ascertained variables and parameters are able to be stored.

According to one specific embodiment of the present invention, the sensor system has at least one further component, which is actuable by the signal processing unit for the selective influencing of the temperature of the sensor unit.

This may achieve the technical advantage that the sensor system is able to be actively brought to different temperatures in order to determine the at least one temperature compensation parameter.

According to one specific embodiment of the present invention, the signal processing unit is designed to correct measured values of the sensor measuring variable acquired during a measuring operation of the sensor system using corresponding temperature compensation parameters and to output temperature-corrected measured values of the sensor measuring variable.

This may achieve the technical advantage of providing a sensor system which has greater measuring accuracy. After a successful determination of the temperature compensation parameters and the related calibration of the sensor system, the sensor system is able to output measured values of the sensor measuring variable that have been temperature-corrected during the measuring operation.

According to one specific embodiment of the present invention, the sensor unit is a MEMS rotation-rate sensor unit, a MEMS acceleration sensor unit, a magnetic sensor unit or a MEMS pressure sensor unit.

This achieves the technical advantage that the sensor system has a broad application range.

According to one specific embodiment of the present invention, the reference value is stored in the signal processing unit or an external memory unit or it is ascertainable using a further reference sensor unit.

This may achieve the technical advantage that it is possible to use reference values that were ascertained at the factory and produced after the conclusion of the production process with the aid of a corresponding series of measurements for determining the temperature compensation parameters. Alternatively, it is also possible to use reference values that were generated during the operation of the sensor system. A corresponding series of measurements is able to be performed for this purpose via the sensor system. As an alternative, a corresponding series of measurements is able to be carried out via an additional reference sensor unit. The reference sensor unit may be a system component of the sensor system or be embodied as an external sensor unit.

Exemplary embodiments of the present invention are shown in the figures and described in greater detail below.

BRIEF DESCRIPTION OF THE DRAWINGS

FIG. 9 shows a schematic flow diagram for the use of different sets of temperature compensation parameters of a sensor unit 803 as a function of the required measuring accuracy or quality of the measurement data.

Below, the same reference numerals may be used for similar features.

DETAILED DESCRIPTION OF EXAMPLE EMBODIMENTS

Figure 1:
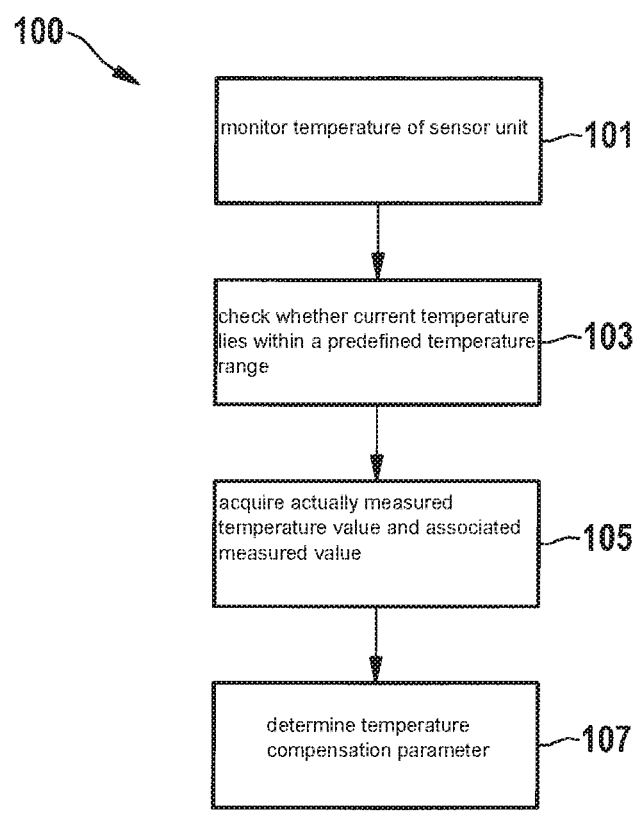
FIG. 1 shows a flow diagram of a method for determining at least one temperature compensation parameter for the compensation of temperature effects on the measured values of a sensor system according to one specific embodiment of the present invention.

FIG. 1 shows a flow diagram of method 100 for determining at least one temperature compensation parameter for the compensation of temperature effects on measured values XV of a sensor system 800 according to a specific embodiment of the present invention. For a better understanding, method 100 is always described in connection with the design of a sensor system 800 according to FIGS. 7 through 9.

Sensor system 800 includes a sensor unit 803 for acquiring measured values XV of a sensor measuring variable X, a temperature sensor unit 805 for monitoring the temperature of sensor unit 803 and for acquiring corresponding temperature values TV, and a signal processing unit 807 for determining a temperature compensation parameter TC.

According to method 100 according to the present invention shown in FIG. 1, the measuring situation of sensor unit 803 is continually monitored in order to determine whether the current measuring situation corresponds to a reference measuring situation for which at least one reference measured value of sensor measuring variable X is known. In parallel therewith, temperature TV of sensor unit 803 is continually monitored. The monitoring of the measuring situation and the monitoring of the temperature of the sensor unit take place in method step 101.

When sensor unit 803 is in the reference measuring situation, it is checked in method step 103 whether the current temperature of sensor unit 903 lies within a predefined temperature range TR2 and whether the current temperature of sensor unit 803 is relevant for a new determination or an update of a temperature compensation parameter.

If this is the case, actually measured temperature value TV and associated measured value XV of sensor unit 803 are acquired in method step 105. Method steps 101 through 105 are cycled through until at least two measured values XV1 and XV2 for different temperature values TV1, TV2 have been acquired for the reference measuring situation. Only then will at least one temperature compensation parameter TC be determined in method step 107 on the basis of these measured values XV1, SV2 and associated temperature values TV1, TV2, that is to say, on the basis of the reference measured value of sensor measuring variable X.

In the context of the invention described here, the measuring situation of sensor unit 803 is defined by the measuring variable. If an acceleration sensor is involved, for example, the measuring situation is described by the magnitude of the acceleration acting on the sensor unit, and in the case of a rotation-rate sensor it is described by the magnitude of the rotational speed acting on the sensor unit. A reference measuring situation denotes a measuring situation for which the measuring variable is known. In the case of inertial sensors, the neutral position suggests itself as the reference measuring situation because no forces other than the earth's gravitational pull are acting on the sensor unit. In the case of a rotation-rate sensor, the reference measured value in the neutral position is therefore equal to zero. However, within the framework of the present invention, it is also possible to select some other reference measuring situation as long as a corresponding reference measured value is known for this reference measuring situation. Such reference measured values are able to be obtained within the scope of a calibration process at the factory, for example.

As described above, in step 103, it is determined whether the temperature of sensor unit 803 lies within a predefined temperature range TR2 and whether the current temperature of sensor unit 803 is relevant for the renewed determination or updating of a temperature compensation parameter.

The predefined temperature range TR2 may simply be the entire temperature range for which sensor unit 803 is configured at the factory. Depending on the intended use of sensor unit 803, however, it may also be advantageous to determine temperature compensation parameters only for a subrange of this temperature range if the sensor unit is preferably operated within this sub-temperature range.

The determination of the temperature compensation parameters is based on at least two measurements/measured values XV1 and XV2 of the sensor unit in the reference measuring situation at different temperatures TV1 and TV2. In order to ensure that the temperature compensation parameters reproduce the temperature characteristic of the sensor unit as realistically as possible, these temperatures TV1 and TV2 should clearly differ. In an advantageous manner, the difference between TV1 and TV2 is used as a criterion for the selection of measurements XV1 and XV2.

The method according to the present invention is based on the assumption that the temperature effect on the measured values of the sensor unit in the predefined temperature range is able to be described by a model. The temperature compensation parameters ascertained according to the present invention involve model parameters for this model. With the aid of the method according to the present invention, it is therefore possible to determine during an ongoing operation of a sensor unit individual model parameters for this sensor unit which are able to describe the temperature effect on the measured values of this individual sensor unit. In addition, the present invention is based on the assumption that the sensor unit has essentially the same temperature response in the entire measuring range, i.e., for all measuring situations. It is therefore considered sufficient to determine sensor-unit-individual temperature compensation parameters for the reference measuring situation. On the basis of the thereby individualized model, temperature compensation variables for the compensation of the temperature effect on this measured value are then able to be ascertained for every measured value of the sensor unit and every temperature within the predefined temperature range.

For example, a temperature compensation parameter may be a parameter of a mathematical function that is able to describe a temperature characteristic of sensor measuring variable X. For instance, a temperature parameter may be a gradient or an axis intercept of a linear equation by which a linear temperature characteristic of the sensor measuring variable is able to be described. Alternatively, a temperature compensation parameter TC can be a coefficient of a polynomial equation by which a non-linear temperature characteristic of the sensor measuring variable is describable. Alternatively, a temperature compensation parameter TC may be a parameter or a coefficient of a more complex model with the aid of which a temperature characteristic of sensor measuring variable X is able to be described.

Within the scope of the determination of the temperature compensation parameters TC as model parameters or as function parameters of a mathematical function that describes the temperature effect on sensor measuring variable X, temperature compensation parameters TC as variable parameters of the model or the mathematical function are varied in such a way that the temperature characteristic of acquired measured values XV of sensor measuring variable X is described as best as possible by the model or the mathematical function. In this way, assuming a linear characteristic of the temperature behavior, the gradient and the offset of the linear function as temperature compensation parameters are able to be determined from the at least two measured values XV1 and XV2 at TV1 and TV2.

With the aid of the respective model or the respective mathematical function, a temperature compensation of the measured values of the sensor unit acquired during the operation of sensor system 803 is then able to be carried out. Based on the model or the mathematical function that covers the entire predefined temperature range in each case, a complete temperature compensation for a wide variety of temperatures and measured values within the predefined temperature range is able to be achieved without the need to determine corresponding measured values XV of sensor measuring variable X and temperature compensation parameters TC for these temperatures according to the present invention.

According to the present invention, the temperature compensation parameters ascertained for a reference measuring situation and the model on which they are based or the mathematical function for describing the temperature characteristic of the sensor measuring variable connected therewith are used for a wide variety of measuring situation of the sensor system.

Figure 2B:
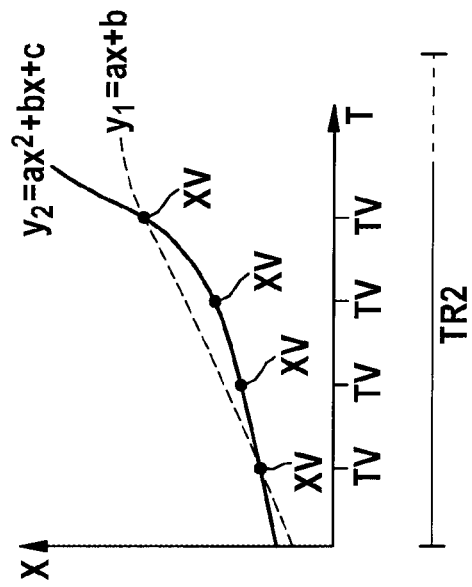
FIGS. 2A and 2B show options for describing the temperature dependency of the sensor measuring variable of a sensor unit in a reference measuring situation by a functional relationship between the sensor measuring variable and the temperature.
Figure 2A:
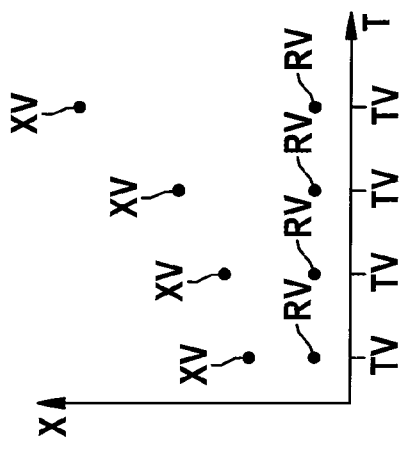

FIGS. 2A and 2B show a schematic representations of a determination of temperature compensation parameters TC according to method 100.

In diagram a), a temperature characteristic of a sensor measuring variable X of a sensor unit 803 of a sensor system 800 is shown, i.e., a plurality of measured values XV acquired at different temperatures TV of sensor unit 803. Measured values XV were acquired in a reference measuring situation of sensor unit 803 which is characterized by reference measured value RV. Measured values XV of the sensor measuring variable exhibit a prominent temperature response and describe a non-constant temperature characteristic.

Diagram b) shows two functions y1 and y2, which are provided for describing the acquired temperature characteristic of sensor measuring variable X:

Y1=ax+b describes a linear characteristic of sensor measuring variable X with the temperature, with "a" describing the gradient, and "b" describing the axis intercept.

Y2=ax2+bx+c describes a square characteristic of sensor measuring variable X with the temperature. "a, b, c" describe polynomial coefficients.

With the aid of the method according to the present invention, these function parameters a, b and c are able to be determined as temperature compensation parameters. Depending on the selection of the function for describing the temperature characteristic of sensor measuring variable X with the temperature, at least two measured values XV1 and XV2 at temperatures TV1 and TV2 are required if a linear relationship exists between the sensor measuring variable and the temperature, or at least three measured values MV1 through MV3 at TV1 through TV3 if a square relationship exists between the sensor measuring variable and the temperature.

The linear and square models shown in FIGS. 2A and 2B are merely examples of a mathematical description of the temperature characteristic of sensor measuring variable X.

Figure 3A:
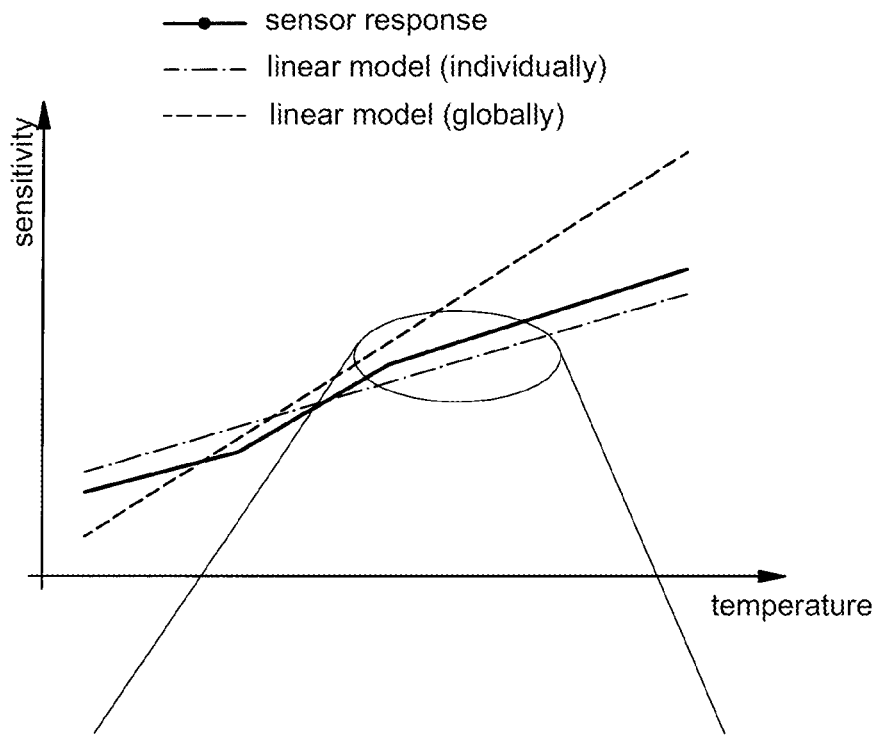
FIGS. 3A and 3B show advantages of a determination of temperature compensation parameters according to the present invention individually for a sensor unit for a selected temperature range over conventional methods for describing the relationship between the temperature and the sensitivity of an individual sensor unit.
Figure 3B:
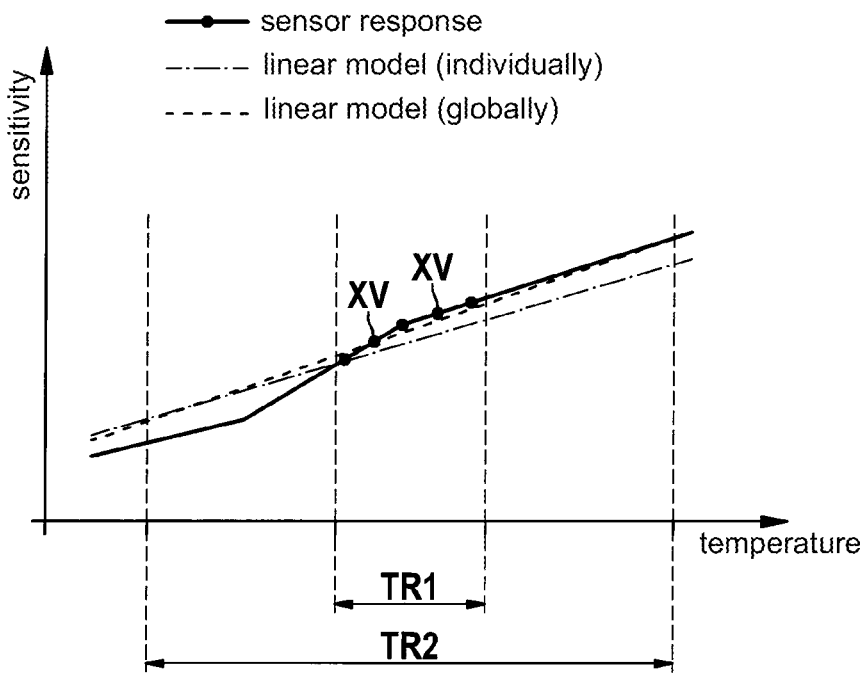

FIGS. 3A and 3B show a schematic illustration of a model development according to method 100 in FIG. 1.

In the diagrams denoted by a) and b), the sensitivity ascertained by measurements or the response behavior of an individual sensor unit 803 has been plotted versus temperature T, i.e. in the form of a solid line.

Moreover, diagram a) shows a first global linear model for describing the temperature characteristic of the sensitivity of sensor unit 803 (dashed line), which was prepared on the basis of a series of comparison measurements of comparable sensor units of a reference group. This model reproduces the actual temperature characteristic of the sensitivity of sensor unit 803 only very inadequately. In diagram a), a further linear model for describing the temperature characteristic of the sensitivity of sensor unit 803 is shown (dash-dotted), which was individually ascertained for this sensor unit 803, that is to say, for the entire temperature range of diagram a). Accordingly, this individual linear model is actually better as a whole than the global linear model. However, in the preferred medium temperature range circled here, even the individual linear model clearly deviates from the actual temperature characteristic of the sensitivity of sensor unit 803.

In diagram b), the individual linear model from diagram a) and a linear model optimized according to the present invention for temperature range TR1 are (individually) shown for the same temperature characteristic of the sensitivity of sensor unit 803. The temperature compensation parameters of the model for the optimized linear model have been adapted by method 100 to the individual characteristics of the sensor unit in a certain measuring situation. For this purpose, measured values XV of sensor measuring variable X have been acquired according to method 100 for a plurality of temperatures within optimization range TR1 in a reference measuring situation in each case, and temperature compensation parameters TC which describe the optimized straight line have been determined on the basis thereof. The gradient of the straight line and/or an axis intercept of the linear model, for instance, is/are able to be determined in this way with the aid of the method according to the present invention. Optimization range TR1 has been selected because sensor unit 803 is preferably operated within this temperature range.

Diagram b) shows that the linear model obtained in this manner is optimized only for temperature range TR1 and thus reproduces the temperature characteristic of the sensitivity of sensor unit 803 very well in this temperature range, but this is not necessarily the case outside of temperature range TR1.

Figure 4:
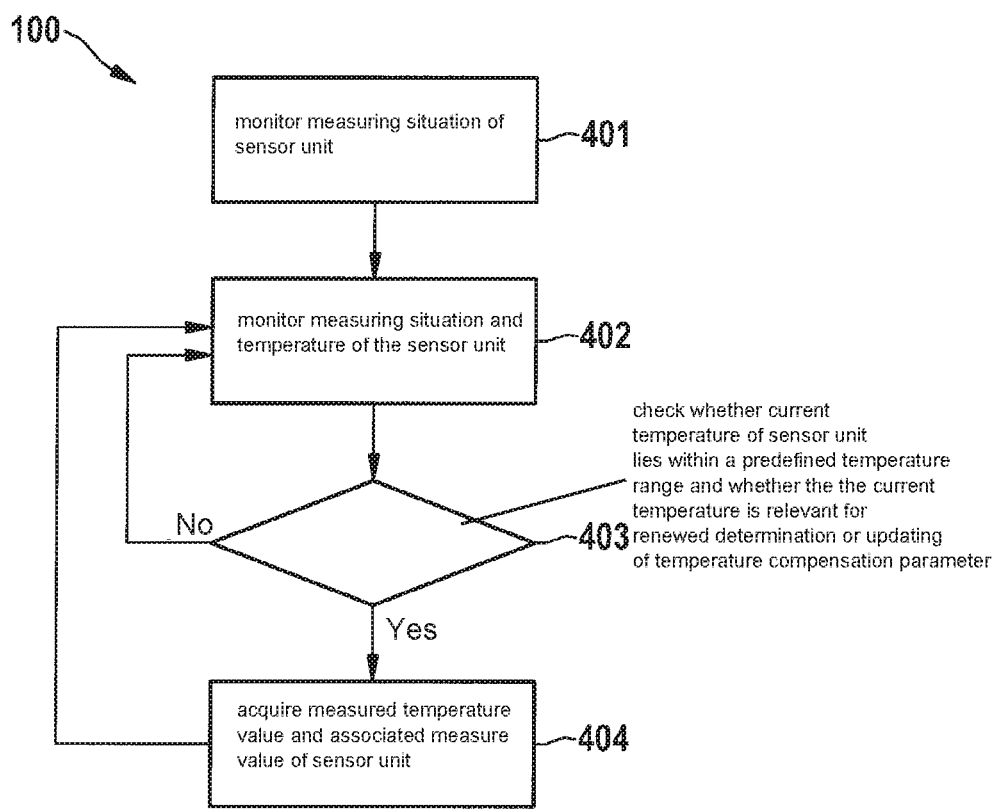
FIG. 4 shows a flow diagram of a first variant of the method according to the present invention for determining temperature compensation parameters for a sensor unit 803 without an active temperature control.

FIG. 4 shows a flow diagram of a first variant of the method according to the present invention for determining temperature compensation parameters for a sensor unit 803 without an active temperature control. In other words, method 100 according to the present invention is operated in a passive mode in which temperature values TV for which measured values XV of sensor measuring variable X are to be acquired are not actively set. Instead, temperature values TV of sensor unit 803 correspond to the temperature prevailing within sensor system 800 at the location of sensor unit 803. As soon as this temperature assumes a temperature value TV for which a measured value XV of sensor measuring variable X is to be acquired, sensor unit 803 acquires a measured value XV of sensor measuring variable X, which will be described in greater detail in the following text with the aid of FIG. 4.

After the start of the method according to the present invention in step 401, the measuring situation of sensor unit 803 is continually monitored in order to determine whether the current measuring situation corresponds to a reference measuring situation for which at least one reference measured value of sensor measuring variable X is known. This was already described in great detail in connection with FIG. 1. In parallel therewith, temperature TV of sensor unit 803 is monitored on a continuous basis. The monitoring of the measuring situation and the monitoring of the temperature of the sensor unit take place in method step 402.

When sensor unit 803 is in the reference measuring situation, it is checked in method step 403 whether the current temperature of sensor unit 803 lies within a predefined temperature range TR2 and whether the current temperature of sensor unit 803 is relevant for the renewed determination or updating of a temperature compensation parameter. Already acquired measured value pairs (XV, TV), for instance, are also able to be taken into account here in order to ensure a certain distribution of the acquired measured value pairs across the predefined temperature range.

If the current temperature of the sensor unit satisfies all criteria for a measured value acquisition, then the currently measured temperature value TV and the associated measured value XV of sensor unit 803 are acquired in method step 404.

Method steps 401 through 404 are cycled through again until at least two measured values XV1 and XV2 for different temperature values TV1, TV2 have been acquired for the reference measuring situation. This is ensured by the branching operations from method steps 403 and 404 back to method step 402. Only then will at least one temperature compensation parameter TC be determined in a further method step, which is not shown here, based on the measured values XV1, XV2 acquired in the reference measuring situation and the associated temperature values TV1, TV2.

Figure 5:
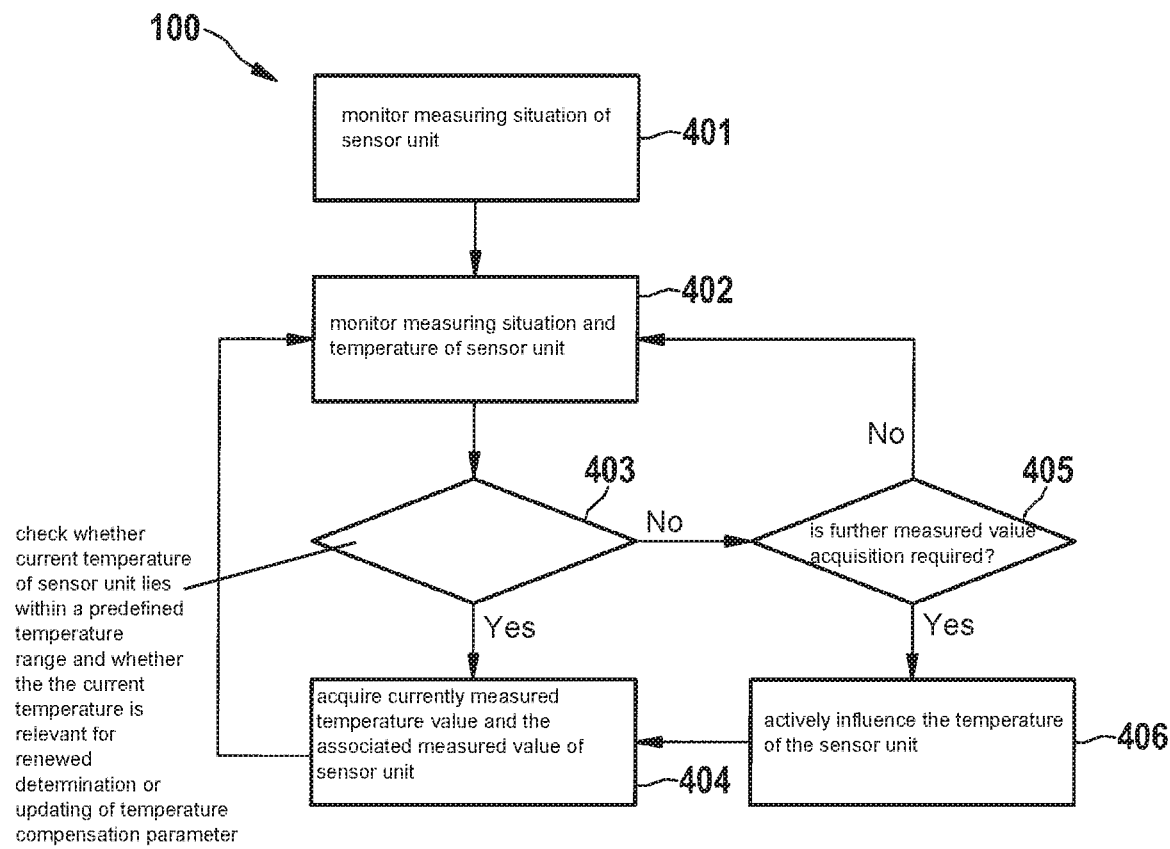
FIG. 5 shows a flow diagram of a second variant of the method according to the present invention for determining temperature compensation parameters for a sensor unit 803 having an active temperature control.

FIG. 5 shows a flow diagram of a second variant of the method according to the present invention for determining temperature compensation parameters for a sensor unit 803 having an active temperature control. In other words, in this method variant temperature values TV for which measured values XV are to be acquired are actively brought about by actively heating or cooling sensor unit 803.

In FIG. 5, the same reference numerals are used for the method steps previously described in connection with FIG. 4. The following description is restricted to the differences to the method variant illustrated in FIG. 4.

In the event that the check in method step 403 indicates that the current temperature of the sensor unit does not satisfy all criteria for a measured value acquisition, then it is checked in a further verification step 405 whether a further measured value acquisition is required to begin with. If this is not the case, the monitoring of the temperature of sensor unit 803 is continued in that the method returns to method step 402.

However, if a further measured value acquisition is to take place, then the temperature of sensor unit 803 is actively influenced in method step 406 until sensor unit 803 has reached an appropriate temperature. For example, heating means of sensor system 800 are able to be activated for this purpose.

As soon sensor unit 803 has reached a temperature that is suitable for the measured value acquisition, sensor measured value XV and the associated temperature value are acquired in method step 404.

Figure 6:
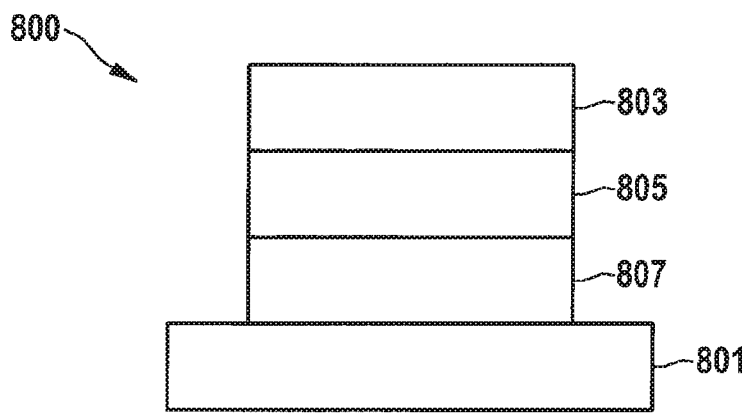
FIG. 6 shows a schematic illustration of a sensor system according to a specific embodiment of the present invention.

FIG. 6 shows a schematic representation of a sensor system 800 according to a specific embodiment.

According to FIG. 6, sensor system 800 includes a carrier 801 for the accommodation of components of sensor system 800; a sensor unit 803 for acquiring measured value XV of a sensor measuring variable X; a temperature sensor unit 805 for monitoring the temperature of sensor unit 803 and for acquiring temperature values TV of sensor unit 803; and a signal processing unit 807, which is designed to monitor the measuring situation of sensor unit 803 and to determine whether the current measuring situation corresponds to a reference measuring situation for which at least one reference measured value of sensor measuring variable X is known; to monitor temperature TV of sensor unit 803 and to determine whether the current temperature lies within a predefined temperature range TR2; to actuate sensor unit 803 and temperature sensor unit 805 so that at least two different temperature values TV1, TV2 within the predefined temperature operating range TR2 together with the respective associated measured values XV1, XV2 of sensor measuring variable X are acquired when the current measuring situation corresponds to a reference measuring situation. Signal processing unit 807 is furthermore designed to determine at least one temperature compensation parameter TC on the basis of the at least one reference measured value of sensor measuring variable X, the at least two different temperature values TV1, TV2 and associated measured values XV1, XV2 of sensor measuring variable X.

In FIG. 6, sensor unit 803, temperature sensor unit 805, and signal processing unit 807 are stacked on top of one another on carrier 801. Sensor unit 803, temperature sensor unit 805 and signal processing unit 807 may alternatively be situated next to one another. Moreover, sensor system 800 may also include still further components, and/or the sensor units can be stacked on top of one another in a different sequence than that shown in FIG. 7 as long as thermal coupling between sensor unit 803 and temperature sensor 805 is provided. Carrier 801 may be a substrate. Alternatively, carrier 801 may also be embodied as a housing part of a housing of sensor system 800.

Sensor unit 803 may be a rotation-rate sensor unit, an acceleration sensor unit, a pressure sensor unit, a magnetic sensor unit or some comparable sensor unit. Accordingly, sensor measuring variable X may be a rate of rotation, an acceleration, a pressure, a magnetic field strength or some further physical variable able to be acquired with the aid of sensor unit 803.

In a deviation from the matter illustrated in FIG. 6, a sensor system 800 may also include additional components such as analog components and possibly non-programmable digital components. Also, the components shown in FIG. 6 may be placed in a deviating arrangement.

Figure 7:
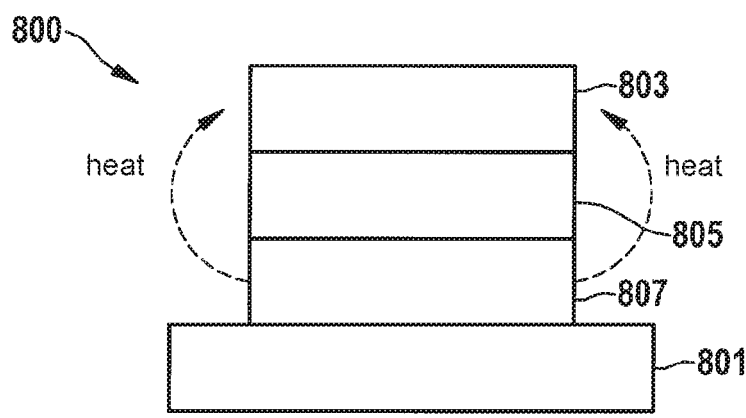
FIG. 7 shows a schematic illustration of an internal heat development of the sensor system in FIG. 6.

FIG. 7 shows a schematic illustration of an internal heat development of sensor system 800 in FIG. 6. In FIG. 7, heat that is generated by the operation of signal processing unit 807 is conducted from signal processing unit 807 to temperature sensor unit 805 and to sensor 803 with the aid of a thermal connection between signal processing unit 807, temperature sensor unit 805 and sensor unit 803. This heat development generated by the operation of signal processing unit 807 and the further conduction of the heat to temperature sensor unit 805 and sensor unit 803 may, among other things, be used for heating MEMS sensor system 800 to temperature values for which measured values XV of sensor measuring variable X are to be acquired according to actuation step 111 of method 100.

Figure 8:
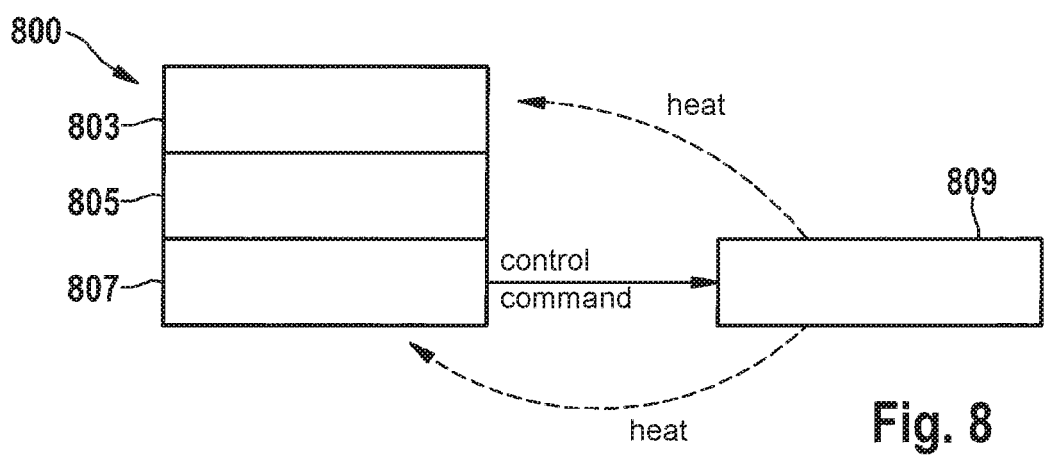
FIG. 8 shows a schematic illustration of an external heat development of the sensor system in FIG. 6.

FIG. 8 shows a schematic illustration of an external heat development of sensor system 800 in FIG. 6. Via control commands of signal processing unit 807 to system components 809 of sensor system 800, these system components 809 are controlled for the operation. The heat produced by the operation of system components 809 is transmitted via a thermal connection to sensor unit 803 and temperature sensor unit 805. This leads to heating of temperature sensor unit 805 and sensor unit 803. Sensor system 800 is thereby able to be heated according to actuation step 111 to a temperature value TV for which a measured value XV is to be acquired. System components 809, for instance, may include a display that develops heat suitable for heating sensor system 800 to a corresponding temperature value TV during an operation. However, system components 809 may possibly also encompass additional components which are able to induce heating of sensor system 800 by a corresponding actuation.

FIG. 9 shows a schematic flow diagram of a determination of a temperature compensation parameter TC according to method 100 of a sensor system 800 according to different modes.

In point 1101, sensor system 800 having sensor unit 803 is switched on in a start phase. In selection point 1103, the user is able to select whether sensor unit 803 is to be operated at a high measuring accuracy or a normal measuring accuracy. If a normal measuring accuracy is selected, then it is checked in selection point 1105 which temperature compensation parameters are available, that is to say, whether only those of the factory-side calibration are available or also already individualized temperature compensation parameters that were ascertained by the method according to the present invention. If only the temperature compensation parameters of the factory-side calibration are available, then they are used in step 1107 for the compensation of the temperature effects on the measured sensor values until sensor unit 803 is powered down or switched off again in step 1119. In the other case, the individualized temperature compensation parameters are used in step 1109 until the sensor unit is deactivated in step 1119. In all instances, the already available temperature compensation parameters are utilized when sensor unit 803 is to be operated at a normal data quality, i.e. at a normal measuring accuracy. The method according to the present invention for determining individualized temperature compensation parameters will not be triggered in this case.

If a high measuring accuracy is selected in selection point 1103, then it is also checked in selection point 1111 whether only the temperature compensation parameters of the factory-side calibration are available or also already individualized temperature compensation parameters that were determined with the aid of the method according to the present invention. If already individualized temperature compensation parameters are available, then a compensation for the temperature effects on the sensor measured values takes place in step 1117 on the basis of these individualized temperature compensation parameters. However, if no individualized temperature compensation parameters are available so far, then the method according to the present invention is triggered in step 1113 for the determination of such individualized temperature compensation parameters and the method is carried out during an ongoing operation of sensor unit 803 until individualized temperature compensation parameters have been determined. In step 1115, a temperature compensation is then performed on the basis of these individualized temperature compensation parameters in order to thereby achieve the required high measuring accuracy or data quality. In contrast to the previously described mode featuring a normal data quality, the method for determining individualized temperature compensation parameters is thus triggered in an automatic manner if no such individualized temperature compensation parameters are available.

What is claimed is:

1. A method for determining at least one temperature compensation parameter for compensating temperature effects on measured values of a sensor system, the sensor system including a sensor configured to acquire measured values of a sensor measuring variable, a temperature sensor configured to acquire a temperature of the sensor, and a signal processor configured to determine at least one temperature compensation parameter and to compensate temperature effects on the measured values of the sensor, the method comprising the following steps:

monitoring a temperature of the sensor and determining whether a current temperature of the sensor corresponds to a reference temperature for which at least one reference measured value of the sensor measuring variable is known and whether the current temperature of the sensor lies within a predefined temperature range;

acquiring at least two different temperature values of the sensor within the predefined temperature range and acquiring respective associated measured values of the sensor measuring variable when the current temperature corresponds to the reference temperature;

determining at least one temperature compensation parameter based on the at least one reference measured value of the sensor measuring variable, the at least two different temperature values, and the associated measured values of the sensor measuring variable.

2. The method as recited in claim 1, wherein the temperature is monitored using at least one further sensor and/or a circuit system, which is a component of the sensor system or a device in which the sensor system is installed.

3. The method as recited in claim 1, wherein a difference between the at least two different temperature values is greater than a predefined threshold value.

4. The method as recited in claim 1, wherein the at least one temperature compensation parameter is determined as a model parameter for a model that describes a temperature effect on the sensor measuring variable so that a temperature compensation variable for a measured value acquired at a particular temperature value is determined based on the model for a random temperature value.

5. The method as recited in claim 1, wherein the at least one temperature compensation parameter is determined as a coefficient and/or a constant of a function that describes a functional relationship between temperature and sensor measuring variable in a reference temperature within the predefined temperature range so that a temperature compensation variable for the measured value acquired at a particular temperature value is determined for a random temperature value based on the function.

6. The method as recited in claim 1, wherein the processor and/or at least one further component of the sensor system, is selectively actuated to heat and/or cool the sensor to at least a first and/or at least a second temperature value within the predefined temperature range and to acquire the respective associated measured values of the sensor measuring variable.

7. The method as recited in claim 1, wherein the method is carried out: (i) during the installation and/or in a start phase of the sensor system, and/or (ii) repeatedly, at regular time intervals, and/or (iii) automatically in an event-controlled and/or user-initiated manner.

8. The method as recited in claim 1, wherein a temperature-dependent offset of the sensor measuring variable and/or a temperature dependency of a response behavior of the sensor is compensated based on the at least one temperature compensation parameter.

9. A sensor system, comprising:

a sensor configured to acquire measured values of a sensor measuring variable;

a temperature sensor configured to acquire a temperature value of the sensor system; and a signal processing unit processor configured to:

monitor a temperature of the sensor and determine whether a current temperature of the sensor corresponds to a reference temperature for which at least one reference measured value of the sensor measuring variable is known and whether the current temperature of the sensor lies within a predefined temperature range;

actuate the sensor and the temperature sensor so that at least two different temperature values within the predefined temperature operating range together with respective associated measured values of the sensor measuring variable are acquired when the current temperature corresponds to the reference temperature; and determine at least one temperature compensation parameter based on the at least one reference measured value of the sensor measuring variable, the at least two different temperature values, and the associated measured values of the sensor measuring variable.

10. The sensor system as recited in claim 9, further comprising:

at least one further sensor and/or a circuit system, configured to monitor the temperature of the sensor.

11. The sensor system as recited in claim 9, further comprising:

at least one data memory configured to store: (i) the acquired at least two different temperature values and the respective associated measured values of the sensor measuring variable, and/or (ii) the at least one temperature compensation parameter, and/or (iii) a predefined threshold value for a difference between the at least two different temperature values.

12. The sensor system as recited in claim 9, further comprising:

at least one further component actuable by the signal processor for selective influencing of the temperature of the sensor.

13. The sensor system as recited in claim 9, wherein the signal processor is configured to correct measured values of the sensor measuring variable acquired in a measuring operation of the sensor system and to output temperature-corrected measured values of the sensor measuring variable.

14. The sensor system as recited in claim 9, wherein the sensor is a MEMS rotation-rate sensor, or a MEMS acceleration sensor, or a magnetic sensor, or a MEMS pressure sensor.

* * * * *